United States Patent [19]

Strom et al.

[11] Patent Number: 5,189,010
[45] Date of Patent: Feb. 23, 1993

[54] PROCESS FOR PREPARING SUPERCONDUCTIVE THICK FILMS

[75] Inventors: Laurie A. Strom, Geneseo; Edward Carnall,Jr.; Steven A. Ferranti, both of Rochester; Jose M. Mir, Webster, all of N.Y.

[73] Assignee: Eastman Kodak Company, Rochester, N.Y.

[21] Appl. No.: 712,390

[22] Filed: Jun. 10, 1991

Related U.S. Application Data

[62] Division of Ser. No. 556,520, Jul. 20, 1990, Pat. No. 5,087,607.

[51] Int. Cl.$^5$ .................. H01B 12/06; C01G 3/00; C04B 41/89; H01L 39/12
[52] U.S. Cl. ....................... 505/1; 505/737; 505/739; 505/741; 505/778; 505/780; 505/782; 501/152; 501/123; 501/126; 252/518; 252/521
[58] Field of Search ............. 505/1, 741, 737, 739, 505/778, 780, 782; 501/152, 123, 126; 252/518, 521

[56] References Cited

U.S. PATENT DOCUMENTS

| | | | |
|---|---|---|---|
| 4,326,785 | 2/1982 | Suzuki et al. | 427/63 |
| 4,336,242 | 6/1982 | Schmidberger et al. | 423/594 |
| 4,395,436 | 7/1983 | Bianchi et al. | 427/53.1 |
| 4,571,350 | 2/1986 | Parker et al. | 427/109 |
| 4,880,770 | 11/1989 | Mir et al. | 505/1 |
| 4,908,346 | 3/1990 | Strom et al. | 505/1 |
| 4,950,643 | 8/1990 | Agostinelli et al. | 505/1 |

FOREIGN PATENT DOCUMENTS 56-85814 7/1941 Japan .

OTHER PUBLICATIONS

Nobumasa et al., "Formation of a 100 K Superconducting Bi(Pb)-Sr-Ca-Cu-O Film by Spray Prolysis", *Jap. Jour. App. Phys.*, vol. 27, #9, Sep. 1988, pp. L1669–L1671.
Hashimoto et al., "Superconductivity and Substrate Interaction of Screen-Printed Bi-Sr-Ca-Cu-O Films". *Jap Jour. Appl Phy.* vol. 27 #3, Mar. 1988.
J. G. Bednorz and K. A. Müller, "Possible High $T_c$ Superconductivity in the Ba-La-Cu-O System", *Z. Phys. B.—Condensed Matter*, vol. 64, pp. 189–193 (1986).
C. W. Chu, et al., "Evidence for Superconductivity above 40 K in the La-Ba-Cu-O Compound System", *Physical Review Letters*, vol. 53, No. 4, pp. 405–407, Jan. 1987.
C. W. Chu, et al., "Superconductivity at 52.5 K in the Lanthanum-Barium-Copper-Oxide System", *Science Reports*, vol. 235, pp. 567–569, Jan. 1987.

(List continued on next page.)

*Primary Examiner*—Mark L. Bell
*Attorney, Agent, or Firm*—J. Jeffrey Hawley; Carl O. Thomas; Bernard D. Wiese

[57] ABSTRACT

A process of forming on a substrate a coating of a precursor of a crystalline rear earth alkaline earth copper oxide or heavy pnictide mixed alkaline earth copper oxide electrical conductor and converting the precursor to the crystalline electrical conductor. The coating precursor is provided by (a) preparing a solution comprised of a volatilizable solvent and, as a solute, metal-ligand compounds of each of the metals forming the crystalline electrical conductor, the proportions of the solute metals corresponding to those present in the precursor coating and the ligands being inorganic ligands chosen to be volatilizable on heating, (b) spraying the aqueous solution to form discrete liquid particles each containing the metals as metal-ligand compounds in proportions corresponding to those present in the precursor coating, (c) evaporating at least a portion of the volatilizable solvent from the liquid particles to form solid particles each containing the metals as metal-ligand compounds in proportions corresponding to those present in the precursor coating. The solid particles can be formulated as a screen printing composition to facilitate coating on the substrate.

10 Claims, 2 Drawing Sheets

OTHER PUBLICATIONS

R. J. Cava, et al., "Bulk Superconductivity at 36 K in $La_{1.8}Sr_{0.2}CuO_4$", *Physical Review Letters*, vol. 58, No. 4, pp. 408–410, Jan. 1987.

J. M. Tarascon, et al., "Superconductivity at 40 K in the Oxygen-Defect Perovskites $La_{2-x}Sr_xCuO_{4-y}$", *Science Reports*, vol. 235, pp. 1373–1376, Mar. 13, 1987.

M. K. Wu, et al., "Superconductivity at 93 K in a New Mixed-Phase Y–Ba–Cu–O Compound System at Ambient Pressure", *Physical Review Letters*, vol. 58, No. 9, pp. 908–910, Mar. 2, 1987.

Koinuma et al., "High $T_c$ Superconductivity in Screen Printed Yb–Ba–Cu–O Films", *Jpn. J. Appl. Phys.*, vol. 6, No. 5, May 1987, pp. L761–L762.

T. Nakamori, et al., "Preparation of Superconducting Bi–Ca–Sr–Cu–O Printed Thick Films Using a Coprecipitation of Oxalates", *Japanese Journal of Applied Physics*, vol. 27, No. 4, Apr. 1988, pp. L649–L651.

K. Hoshino, et al., "Preparation of Superconducting Bi–Sr–Ca–Cu–O Printed Thick Films on MgO Substrate and Ag Metal Tape", *Japanese Journal of Applied Physics*, vol. 27, No. 7, Jul. 1988, pp. L1297–L1299.

Kodas et al., "Aerosol Flow Reactor Production of $Y_1Ba_2Cu_3O_7$ Powder: Fabrication of Superconducting Ceramics", *Appl. Phys. Lett.* 52(19) May 1988, pp. 1622–1624.

PROCESS FOR PREPARING SUPERCONDUCTIVE THICK FILMS

This is a division of application Ser. No. 556,520, filed on Jul. 20, 1990, now issued as U.S. Pat. No. 5,087,607, which consists of the combined subject matter of U.S. Ser. No. 291,921, filed Dec. 29, 1988, now abandoned, and U.S. Ser. No. 327,472, filed Jul. 1, 1987, now abandoned. U.S. Ser. No. 327,472 is a division of application U.S. Ser. No. 68,391, filed Jul. 1, 1987, now issued as U.S. Pat. No. 4,908,346.

FIELD OF THE INVENTION

The invention relates to processes and compositions for preparing thick film electrical conductors. In a specific preferred form this invention relates to electrical conductors which are superconductors.

BACKGROUND OF THE INVENTION

The term "superconductivity" is applied to the phenomenon of immeasurably low electrical resistance exhibited by materials. Until recently superconductivity had been reproducibly demonstrated only at temperatures near absolute zero. As a material capable of exhibiting superconductivity is cooled, a temperature is reached at which resistivity decreases (conductivity increases) markedly as a function of further decrease in temperature. This is referred to as the superconducting onset transition temperature or, in the context of superconductivity investigations, simply as the critical temperature ($T_c$). $T_c$ provides a conveniently identified and generally accepted reference point for marking the onset of superconductivity and providing temperature rankings of superconductivity in differing materials. The highest temperature at which superconductivity is observed in a material is designated $T_0$.

Unless otherwise indicated, the term "thick film" refers to films having thicknesses of greater than 5 $\mu m$ while the term "thin film" refers to films having thicknesses which are in all instances less than 5 $\mu m$ and more typically less than 1 $\mu m$.

The following art is relevant or was previously cited by the Examiner in one or more patent applications previously filed claiming the subject matter of this invention:

P-1: J. G. Bednorz and K. A. Müller, "Possible High $T_c$ Superconductivity in the Ba-La-Cu-O System", *Z. Phys. B.-Condensed Matter*, Vol. 64, pp. 189-193 (1986) revealed that polycrystalline compositions of the formula $Ba_xLa_{5-x}Cu_5O_{5(3-y)}$, where $x=1$ and 0.75 and $y>0$ exhibited superconducting transition temperatures in the 30° K. range.

P-2: C. W. Chu, P. H. Hor, R. L. Meng, L. Gao, Z. J. Huang, and Y. Q. Wang, "Evidence for Superconductivity above 40K in the La-Ba-Cu-O Compound System", *Physical Review Letters*, Vol. 53, No. 4, pp. 405-407, January 1987, reported increasing $T_c$ to 40.2° K. at a pressure of 13 kbar. At the end of this article it is stated that M. K. Wu increased $T_c$ to 42° K. at ambient pressure by replacing Ba with Sr.

P-3: C. W. Chu, P. H. Hor, R. L. Meng, L. Gao, and Z. J. Huang, "Superconductivity at 52.5K in the Lanthanum-Barium-Copper-Oxide System", *Science Reports*, Vol. 235, pp. 567-569, January 1987, a $T_c$ of 52.5° K. for $(La_{0.9}Ba_{0.1})_2CuO_{4-y}$ at high pressures.

P-4: R. J. Cava, R. B. vanDover, B. Batlog, and E. A. Rietman, "Bulk Superconductivity at 36K in $La_{1.8}Sr_{0.2}CuO_4$", *Physical Review Letters*, Vol. 58, No. 4, pp. 408-410, January 1987, reported resistivity and magnetic susceptibility measurements in $La_{2-x}Sr_xCuO_4$, with a $T_c$ at 36.2° K. when $x=0.2$.

P-5: J. M. Tarascon, L. H. Greene, W. R. McKinnon, G. W. Hull, and T. H. Geballe, "Superconductivity at 40K in the Oxygen-Defect Perovskites $La_{2-x}Sr_xCuO_{4-y}$", *Science Reports*, Vol. 235, pp. 1373-1376, Mar. 13, 1987, reported title compounds ($0.05 \leq x \leq 1.1$) with a maximum $T_c$ of 39.3° K.

P-6: M. K. Wu, J. R. Ashburn, C. J. Torng, P. H. Hor, R. L. Meng, L. Gao, Z. J. Huang, Y. Q. Wang, and C. W. Chu, "Superconductivity at 93K in a New Mixed-Phase Y-Ba-Cu-O Compound System at Ambient Pressure", *Physical Review Letters*, Vol. 58, No. 9, pp. 908-910, Mar. 2, 1987, reported stable and reproducible superconducting transition temperatures between 80° and 93° K. at ambient pressures for materials generically represented by the formula $(L_{1-x}M_x)_aA_bD_y$, where $L=Y$, $M=Ba$, $A=Cu$, $D=O$, $x=0.4$, $a=2$, $b=1$, and $y \leq 4$.

P-7: Mir U.S. Pat. No. 4,880,770 discloses processes of preparing rare earth alkaline earth copper oxide thin films that are superconductive.

P-8: Kamioka et al Japanese 56-85814 Jul. 13, 1941, cited by the Examiner in U.S. Ser. No. 245,497, filed Sep. 18, 1988, now abandoned; discussed in U.S. Ser. No. 327,472, cited above.

P-10: Koinuma et al, "High $T_c$ Superconductivity in Screen Printed Yb-Ba-Cu-O Films", Jpn. J. of Appl. Phys., Vol. 26, No. 5, May 1987, pp. L761-762, cited by the Examiner in U.S. Ser. No. 245,497, cited above; discussed in U.S. Ser. No. 327,472, cited above.

P-11: Schmidberger et al U.S. Pat. No. 4,336,242, cited by the Examiner and discussed in U.S. Ser. Nos. 291,921 and 347,472, cited above.

P-12: Bianchi et al U.S. Pat. No. 4,395,436, cited by the Examiner and discussed in U.S. Ser. No. 347,472, cited above.

P-13: Suzuki et al U.S. Pat. No. 4,326,785, cited by the Examiner and discussed in U.S. Ser. No. 347,472, cited above.

P-14: T. Hashimoto, T. Kosaka, Y. Yoshida, K. Fueki, and H. Koinuma, "Superconductivity and Substrate Interaction of Screen-Printed Bi-Sr-Ca-Cu-O Films", *Japanese Journal of Applied Physics*, Vol. 27, No. 3, March, 1988, pp. L384-L386, reports successful attempts to form superconductive thick films of bismuth strontium calcium copper oxide on yttrium stabilized zirconia and strontium titanate substrates. Hashimoto et al failed to produce superconducting films on quartz and alumina substrates. The thick films were prepared by screen printing. Bismuth strontium calcium copper oxides with nominal 1112 and 2213 compositions were prepared by calcining bismuth and copper oxides with strontium and calcium carbonates for 800° C. for 12 hours, followed by mixing with a mortar and pestle while adding octyl alcohol to form a paste. The paste was screen printed.

P-15: T. Nakamori, H. Abe, Y. Takahasi, T. Kanamori, and S. Shibata, "Preparation of Superconducting Bi-Ca-Sr-Cu-O Printed Thick Films Using a Coprecipitation of Oxalates", *Japanese Journal of Applied Physics*, Vol. 27, No. 4, April 1988, pp. L649-L651, reports successful attempts to form superconductive thick films of bismuth strontium calcium copper oxide on monocrystalline magnesia substrates. The thick films were prepared by screen printing. Calcium, strontium, and copper chlorides were coprecipitated with oxalates. Bismuth oxalate was separately precipitated from acetone. These two precipitates were separately washed, filtered, and dried before being mixed as solids and heated to 300° C. Bismuth strontium calcium copper oxide with a nominal 1112 composition was prepared.

P-16: K. Hoshino, H. Takahara, and M. Fukutomi, "Preparation of Superconducting Bi-Sr-Ca-Cu-O Printed Thick Films on MgO Substrate and Ag Metal Tape", *Japanese Journal of Applied Physics*, Vol. 27, No. 7, July 1988, pp. L1297–L1299, reports successful attempts to form superconductive thick films of bismuth strontium calcium copper oxide on monocrystalline magnesia substrates, silver, and some metal tapes. The thick films were prepared by calcining techniques similar to those described by Hashimoto et al, cited above. The bismuth strontium calcium copper oxide exhibited a nominal 1112 composition.

P-17: Parker et al U.S. Pat. No. 4,571,350 cited by the Examiner and discussed in U.S. Ser. No. 291,921, cited above.

P-18: Kodas et al "Aerosol Flow Reactor Production of $Y_1Ba_2Cu_3O_7$ Powder: Fabrication of Superconducting Ceramics", Appl. Phys. Lett. 52(19) May 1988, pp. 1622–1624, cited by the Examiner and discussed in U.S. Ser. No. 291,921.

P-19: Nobumasa et al "Formation of a 100K Superconducting Bi(Pb)-Sr-Ca-Cu-O Film by Spray Prolysis", Japanese Journal of Applied Physics, Vol. 27, No. 9, September 2988, L1669–L1671, cited and discussed in U.S. Ser. No. 291,921, cited above.

P-20: Agostinelli et al U.S. Pat. No. 4,950,643, is directed to process of forming a heavy pnictide mixed alkaline earth copper oxide superconductive coating on a substrate by coating metal-organic ligand compounds on a substrate and converting the compounds to a crystalline electrical conductor by heating.

SUMMARY OF THE INVENTION

In one aspect this invention is directed to a process of forming an electrical conductor on a substrate capable of withstanding processing temperatures comprising forming on the substrate a coating of a precursor of a crystalline electrical conductor chosen from the group consisting of (a) a rare earth alkaline earth copper oxide and (b) a heavy pnictide mixed alkaline earth copper oxide and converting the precursor to the crystalline electrical conductor. The process is characterized by the steps of (a) preparing a solution comprised of a volatilizable aqueous solvent and, as a solute, metal-ligand compounds of each of the metals forming the crystalline electrical conductor, the proportions of the solute metals corresponding to those present in the precursor coating and the ligands being inorganic ligands chosen to be volatilizable on heating, (b) spraying the aqueous solution to form discrete liquid particles each containing the metals as metal-ligand compounds in proportions corresponding to those present in the precursor coating, (c) evaporating at least a portion of the volatilizable solvent from the liquid particles to form solid particles each containing the metals as metal-ligand compounds in proportions corresponding to those present in the precursor coating, (d) coating the solid particles together with a volatilizable liquid as a paste on the substrate, and (e) thereafter heating the solid particles in the presence of oxygen to volatilize the ligands and form the precursor as an intermediate coating on the substrate, and (f) converting the intermediate coating to the crystalline electrical conductor.

In another aspect this invention is directed to a screen printing composition comprised of particles containing metal-ligand compounds, where the ligand moieties of the compounds are chosen to be thermally decomposable and the metal moieties of the compounds are chosen to form crystalline superconducting copper oxides on heating, the superconducting copper oxides being chosen from the class consisting of (a) rare earth alkaline earth copper oxides and (b) heavy pnictide mixed alkaline earth copper oxides. The composition is characterized in that the particles all contain the same metals in the same ratios.

The process of the present invention offers the distinct advantage of being capable of producing electrically conductive thick films in a single iteration of the process. That is, sequential iterations of coating conductor precursors and converting these precursors to an electrically conductive form are not required to arrive at thick film dimensions. Additionally, it is quite surprising and advantageous that electrically conductive films, particularly thick films, can be produced by the present invention, since rare earth alkaline earth copper oxides are known to require heating to relatively high temperatures to produce the crystalline phase responsible for electrical conduction. As is generally recognized, the thicker a coating, the larger the mechanical stresses which it must withstand during its formation. Processes which readily produce defect free thin films quite often produce thick films that are riddled with stress fractures, often accompanied by peeling from the substrate on which they are formed. Such defects, of course, render films unsuitable for use as electrical conductors. The present invention provides articles containing electrically conductive films, including thick films, that are capable of low resistance electrical conduction.

In certain preferred forms of the invention the articles produced exhibit high superconducting transition temperatures, where the term "high superconducting transition temperature" is herein defined as a superconducting transition temperature in excess of 30° K. In certain advantageous forms the articles produced by this invention exhibit superconducting transition temperatures and, optimally, true superconductivity, at temperatures in excess of 77° K., the temperature of liquid nitrogen.

The process of the present invention is particularly well suited to the fabrication of electrical circuit components. It is compatible with the formation of patterned electrical conductors. It is capable of producing thick films of desirable electrical conduction properties, including superconducting properties, on a variety of substrates. The process of the invention is further capable of producing films with limited substrate interaction.

The articles of this invention can be fabricated by techniques that avoid the disadvantages of the prior art. No grinding or pulverizing steps are required. In addition, the electrically conductive films can be formed on the substrates with minimal heating of their supporting substrates. Further, the conductive films are compatible with solders, bonding pads, and other commonly employed electrical conduction path connectors.

BRIEF DESCRIPTION OF THE DRAWINGS

These and other advantages of the invention can be better appreciated by reference to the following detailed description of preferred embodiments considered in conjunction with the drawings, in which.

DESCRIPTION OF PREFERRED EMBODIMENTS

The present invention has as its purpose to make available electrically conductive articles exhibiting a copper oxide conductive layer coated on a substrate, where the copper oxide conductive layer is either (a) a rare earth alkaline earth copper oxide (RAC) conductive layer or (b) a heavy pnictide mixed alkaline earth copper oxide (PAC) conductive layer. The term "rare earth alkaline earth copper oxide" refers to a composition of matter containing at least one rare earth element, at least one alkaline earth element, copper, and oxygen. The term "rare earth" is employed to designate yttrium and lanthanides—i.e., elements of the lanthanide series. Lanthanum, samarium, europium, gadolinium, dysprosium, holmium, erbium, and ytterbium are particularly preferred lanthanides. The term "heavy pnictide mixed alkaline earth copper oxide" refers to composition of matter containing at least one heavy pnictide element, at least two alkaline earth elements, copper, and oxygen. The term "alkaline earth" indicates elements of Group 2 of the Periodic Table of elements as adopted by the American Chemical Society. Calcium, strontium and barium are preferred alkaline earth elements for the practice of this invention.

In keeping with the established practice in the ceramics art of shortening lengthy chemical names of mixed metal oxides by substituting acronyms based on the first letters of the metals present, the terms "RAC" and "PAC" are hereinafter employed to indicate generically rare earth alkaline earth copper oxides and heavy pnictide mixed alkaline earth oxides, respectively. When it is intended to designate specifically a lanthanide or yttrium as the rare earth component, L or Y, respectively, is substituted for R; and when it is intended to designate specifically strontium or barium as the alkaline earth component, S or B, respectively, is substituted for A.

Except as otherwise noted, all steps in the preparation of electrically conductive articles according to this invention are understood to be practicable in air at atmospheric pressure. It is, of course, recognized that increasing the proportion of ambient oxygen present and operation at elevated pressures, used separately or together, is generally compatible with the practice of this invention and can be employed, although not required.

Figure 1:
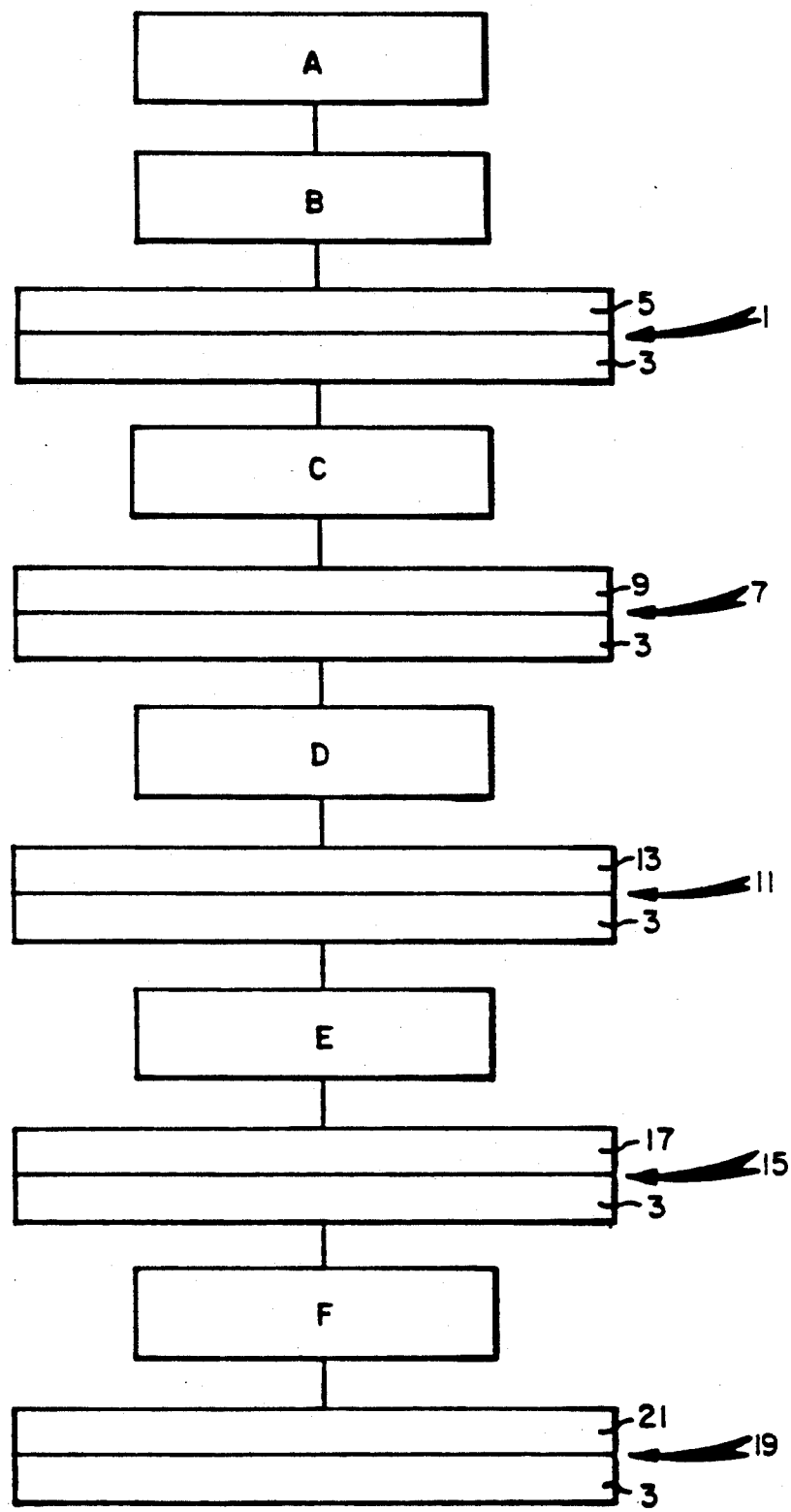
FIG. 1 is schematic diagram showing process steps and articles produced thereby and FIG. 2 is a cross-sectional view of an electric circuit component.

The present invention can be appreciated by the schematic diagram shown in FIG. 1. In Step A a composition containing particles of metal-ligand compounds is obtained. Each particle contains rare earth or heavy pnictide, alkaline earth, and copper atoms in the same ratio desired in the final RAC or PAC containing conductive layer. Further, the atoms are intimately intermixed so that the composition of each particle is preferably essentially uniform. Associated with the metal atoms and completing the compounds are volatilizable ligands, which can be all alike or chosen from among different ligands.

The particles can be of any size convenient for coating. The particles can exhibit a mean diameter up to the thickness of the coating to be formed, but more uniform films are realized when the mean particle diameters are relatively small in relation to the thickness of the film to be formed. The particles are preferably less than about 2 $\mu m$ in mean diameter, optimally less than 1 $\mu m$ in mean diameter. The minimum mean diameter of the particles is limited only by synthetic convenience.

A preferred technique of this invention for producing metal-ligand compound particles is to dissolve the rare earth or heavy pnictide, alkaline earth, and copper metal ligand compounds in a mutual solvent and then to spray the solution through an atomizing nozzle into a gaseous atmosphere. The solvent is chosen to be evaporative in the gaseous atmosphere. Thus, the individual particles are dispersed in the gaseous atmosphere as liquid particles and eventually come to rest at a collection site as either entirely solid particles or particles in which the proportion of solvent has been sufficiently reduced that each of the metal-ligand compounds present has precipitated to a solid form. In the latter instance the particles by reason of the residual solvent, now no longer acting as a solvent, but only as a continuous dispersing phase, form a paste. The paste constitutes a highly convenient coating vehicle. When the particles are collected in a friable form with all or substantially all of the initially present solvent removed, it is recognized that a paste can still be formed, if desired, by adding to the particles a small amount of a liquid to promote particle cohesion—i.e., to constitute a paste.

Only a very small amount of liquid is required to promote particle cohesion and thereby form a paste. Typically the liquid constitutes less than 20 percent of the total composition weight and preferably less 15 percent of the total composition weight. While optimum paste consistencies can vary depending upon the selection of processes for coating the paste, it is generally contemplated that the paste viscosity will be in the range of from $5 \times 10^4$ to $3 \times 10^6$ centipoise, preferably from $1 \times 10^5$ to $2.5 \times 10^6$ centipoise.

While atomization and drying can be undertaken in air at room temperatures, it is recognized that any gaseous medium which does not detrimentally react with the metal-ligand compounds can be employed. Further, the temperature of the liquid forming the particles or, preferably, the gaseous medium can be increased to accelerate the solvent evaporation rate, provided only that such elevated temperatures in all instance be maintained below the thermal decomposition temperatures of the metal-ligand compounds.

The advantage of solidifying the metal-ligand compounds while they are trapped within discrete particles is that bulk separations of the rare earth or heavy pnictide, alkaline earth, and copper are prevented. The particle preparation approach offers distinct advantages over simply evaporating bulk solutions to dryness in that each particle produced by the process of this invention contains the desired ratio of rare earth or heavy pnictide, alkaline earth, and copper elements. This produces a solid particle coating composition of microscale uniformity.

In Step B of the preparation process, onto a substrate are coated the metal-ligand compound particles, preferably combined with a carrier liquid to form a coatable paste or slurry. The resulting coated article 1 as schematically shown consists of substrate 3 and a layer 5 formed by RAC or PAC precursors (metal-ligand compounds) and film forming solvent. Although the layer 5 is shown coextensive with the substrate 3, it is appreciated that the particles are well suited, particularly when coated in the form of a paste or slurry, to being laid down in any desired pattern on the substrate. The paste can, for example, be deposited by any of a variety of conventional image defining coating techniques, such as screen or gravure printing. Since thick conductive films are most commonly formed in the art by screen printing, the present invention is highly compatible with conventional printed circuit preparation processes.

In Step C article 1 is heated to a temperature sufficient to volatilize at least a portion of the ligands and the film forming solvent. The element 7 resulting consists of substrate 3 and intermediate layer 9. In its intermediate form the coating exhibits relatively low levels of electrical conductivity. The exact form of the intermediate coating depends upon the specific choice of ligands and the thermal profile employed in its formation. The intermediate coating in some instances contains relatively stable ligands—e.g., carbon in the form of carbonates. The intermediate coating can range from amorphous to mixtures of crystalline and amorphous phases to mixtures of crystalline phases.

According to accepted percolation theory, for a layer consisting of conducting spheres located in a surrounding nonconducting medium the spheres must account for at least 45 percent by volume of the layer for satisfactory electrical conductivity to be realized. If conducting particles of other geometric forms, particularly elongated forms, are substituted for the spheres, the conducting particles can account for less of the layer volume while still realizing satisfactory layer electrical conductivity. Similarly, electrical conductivity can be realized with a lesser proportion of conducting particles when the surrounding medium is also conductive. Thus, all layers containing at least 45 percent by volume electrically conductive particles are by accepted theory electrically conductive. Although satisfactory electrical conductivity can be realized with a lesser volume of the crystalline phase, it is generally contemplated that in the electrically conductive RAC layer the crystalline phase will account for at least 45 percent by volume and preferably 70 percent by volume of the total RAC or PAC layer. Higher proportions of crystalline phase in the electrically conductive RAC or PAC layer are contemplated, including RAC and PAC layers containing at least 90 percent and, in some instances, greater than 99 percent of the desired electrically conductive crystalline phase.

Referring specifically to forming a RAC layer, in Step D the article 7 is heated to a temperature sufficient to convert the intermediate layer to a more electrically conductive crystalline form. Heating is relied upon both to disspell ligands other than oxygen and to supply the activation energy required for the desired crystalline reordering of the atoms forming the coating to occur. Crystalline reordering involves nucleation of the desired electrically conductive crystalline phase followed by crystal growth. Nuclei of the desired crystalline phase are believed to be initially formed in Step C while growth of the desired electrically conductive crystalline phase is clearly observed in Step D.

Heating to any convenient temperature level can be employed to achieve crystallization of the RAC layer. To avoid interaction with less than inert substrates, it is generally preferred that the RAC layer be heated no higher than is required for satisfactory crystallization. Heating to achieve crystallization can, for example, be limited to temperatures below the melting point of the RAC composition forming the layer. Extended heating temperatures or times beyond those producing crystallization can result in rounding of crystal corners and edges, thereby reducing the area of contact between adjacent crystal facets and restricting the conduction path through the crystalline RAC layer. From microscopic examination of RAC layers optimum heating times can be selected for maximizing both the proportion of the RAC layer accounted for by the crystalline phase and the desired configuration of the crystals produced, thereby maximizing electrical conductivity.

Step E entails controlled cooling of the RAC layer from its crystallization temperature. By slowing the rate of cooling of the crystalline RAC layer imperfections in the crystal lattices can be reduced and electrical conductivity, which is favored with increasing order in the crystal structure, is increased. Cooling rates of 25° C. per minute or less are contemplated until the crystalline RAC layer reaches a temperature of at least 500° C. or, preferably, 200° C. Below these temperatures the lattice is sufficiently rigid that the desired crystal structure is well established. The article 15 produced is formed of the annealed crystalline RAC layer 17 on substrate 3.

While the article 15 exhibits high levels of electrical conductivity, in some instances further heating of the article 15 in an oxygen enriched atmosphere has been observed to increase electrical conductivity. In addition to oxygen supplied from the ligands the oxygen forming the crystalline RAC or PAC layer is obtained from the ambient atmosphere, typically air. It is believed that in some instances, depending upon the crystal structure being produced, ambient air does not provide the proportion of oxygen needed to satisfy entirely the available crystal lattice sites.

Therefore, optional Step F entails heating the article 15 in an oxygen enriched atmosphere, preferably pure oxygen. The object is to equilibrate the RAC crystalline layer with the oxygen enriched atmosphere, thereby increasing the proportion of oxygen in the crystal lattice structure. Temperatures for oxygen enrichment of the crystalline RAC layer are above the minimum annealing temperatures employed in Step E described above. To be effective in introducing oxygen into the crystal lattice temperatures above those at which the lattice becomes rigid are necessary. The duration and temperature of heating are interrelated, with higher temperatures allowing shorter oxygen enrichment times to be employed. Substantially complete oxygen equilibration can be realized at near minimum temperatures in about 1 hour. Maximum oxygen enrichment has been found to occur in the temperature range of from 450° to 500° C.

In preparing RAC layers shown to be benefitted by oxygen enrichment of the ambient atmosphere Step F can be consolidated with either or both of Steps D and E. Oxygen enrichment is particularly compatible with Step E, allowing annealing out of crystal lattice defects and correction of crystal lattice oxygen deficiencies to proceed concurrently. Since each of Steps C, D, E, and F involve heating, it is appreciated that in most instances these steps can be most conveniently practiced as part of a continuous heating profile, one step flowing smoothly into the next.

Referring to formation of the PAC layer at Step C, once the amorphous PAC layer 9 has been formed on the substrate 3 subsequent conversion of this intermediate layer to a final crystalline conductive PAC layer can proceed by any convenient conventional procedure. For example, the crystallization procedures for thick films employed by Hashimoto et al, Nakamori et al, and Hoshino et al, cited above and here incorporated by reference, can, if desired, be employed. One of the recognized fabrication advantages of forming crystalline conductive PAC layers as opposed to crystalline conductive RAC layers is that the former exhibit superconductivity independent of whether an oxidizing or non-oxidizing atmosphere is employed during their manufacture and independent of whether they are cooled slowly at controlled rates or quenched.

The disclosure which follows is directed to a preferred approach to converting an amorphous PAC thick film to a crystalline conductive PAC thick film to its crystalline form is achieved by heating in the temperature range of from 750° to 1000° C. The temperature range of 780° to 850° C. is preferred when a non-oxidizing atmosphere is employed for converting the amorphous PAC thick film to its crystalline conductive form. A non-oxidizing atmosphere can be provided by any convenient relatively inert gas, such as nitrogen or a Group 18 gas, typically argon. Alternatively, a non-oxidizing atmosphere can be created simply by firing the amorphous PAC thick film at a reduced ambient pressure, thereby reducing oxygen availability. On the other hand, when crystallization of the PAC layer is undertaken in air or an oxygen enriched atmosphere, it is preferred to employ temperatures in the range of from about 850° to 950° C.

While a single heating step in either a non-oxidizing or oxygen containing atmosphere can be employed to convert the amorphous PAC thick film to a crystalline conductive PAC thick film, advantages have been observed to flow from employing a firing step in combination with a pre-firing step, a post-firing step, or both. Generally optimum results in terms of realizing superconductivity at the highest possible temperatures are realized when the pre-firing, firing, and post-firing steps are all employed in combination.

Referring to FIG. 1, Step D represents a pre-firing step, Step E represents the firing step, and Step F represents a post-firing step. Although crystals are observed in each of PAC thick films 13, 17, and 21, progressively more desirable crystallizations in terms of crystal phases formed and their orientation are observed with the completion of each firing.

In the presence of oxygen (e.g., in an air or oxygen atmosphere) it is preferred to heat the PAC layer in the temperature range of from 890° to 950° C. during firing step E. In a non-oxidizing atmosphere similar results are achieved in the temperature range of from about 830° to 850° C. It is believed that in these temperature ranges at least some melting of the PAC composition occurs. This improves adhesion to the substrate and also facilitates crystal formation and orientation, either during this step or during subsequent cooling. The PAC layer should be fired within the preferred temperature ranges for at least 5 minutes, preferably at least 10 minutes. Generally the benefit of firing is realized quickly, so that extended firing times are not required. Useful crystalline conductive PAC layers can be achieved when firing times are extended to 100 hours or more, but in practice rarely are firing times in excess of 2 hours employed.

In the pre-firing Step D the PAC layer is heated to temperatures below the firing temperatures of Step E. Pre-firing temperatures are preferably in the range of from 800° to 885° C. in oxygen containing atmospheres and from 780° to 830° C. in non-oxidizing atmospheres. Post-firing temperatures for Step F are preferably in the range of from 870° to 890° C. in oxygen containing atmospheres and from 780° to 830° C. in non-oxidizing atmospheres. Within these temperature ranges convenient pre-firing and post-firing times are generally similar to those suggested above for firing. However, for both pre-firing and post-firing it is possible to reduce firing temperatures somewhat below the preferred ranges and to compensate by extending the pre-firing or post-firing times.

When the crystallization of the PAC layer is undertaken in a non-oxidizing atmosphere, somewhat less than an optimum concentration of oxygen may be present in the layer. It has been observed that low level heating of such crystalline conductive PAC layers in an oxidizing atmosphere, preferably oxygen, even at comparatively low temperatures—e.g., down to about 480° C. can significantly enhance conductivity—e.g., increase $T_o$.

The final electrically conductive article 19 is comprised of a crystalline, electrically conductive RAC layer 21 on substrate 3. Depending upon specific choices of materials and preparation techniques, the article 19 can exhibit a high superconducting transition temperature.

The term "high superconducting transition temperature" is herein defined as a $T_c$ of greater than 30° C.

The process described for preparing electrically conductive articles having RAC or PAC layers offers several distinct advantages. One of the most significant advantages is that the proportions of rare earth or heavy pnictide, alkaline earth, and copper elements in the final RAC or PAC layer 21 exactly correspond to those present in the RAC precursor layer 5. In other words, the final proportion of rare earth, alkaline earth, and copper elements is determined merely by the desired proportions in the the metal-ligand compound particles employed as starting materials. This avoids what can be tedious and extended trial and error adjustments of proportions required by commonly employed metal oxide deposition techniques, such as sputtering and vacuum vapor deposition. Further, the present process does not require any reduction of atmospheric pressures, and thus no equipment for producing either high or low vacuum.

A particular advantage of the present process is that it readily lends itself to the formation of electrical conductor patterns on limited portions of substantially planar substrate surfaces. Thus, the present process is readily applied to the fabrication of printed and hybrid circuits. Patterning can be readily achieved by coating the layer 5 of article 1 in the desired pattern, as described above. As an adjunct or alternative to metal-ligand compound coating patterning any one of the RAC layers 9, 13, 17, or 21 of articles 7, 11, 15, or 19 can be patterned by conventional photoresist pattern definition and etching of the RAC or PAC layer.

Although the foregoing process has been described in terms of extremely simple articles in which the RAC or PAC layer is formed entirely on a insulative substrate, it is appreciated that in many practical applications only a portion of the RAC or PAC layer will be formed directly on a surface of the substrate. For example, in fabricating electrical circuit components it is common practice to first coat metal pads (conductive areas) on an insulative substrate for the purpose of facilitating external lead (pin) connections. The RAC or PAC layer or several portions of the RAC or PAC layer can be formed on the insulative substrate to provide a conduction path or paths between spaced pads or other conductive regions previously formed on the substrate. Any conductive material can be precoated on the substrate which is capable of withstanding the temperatures required to form the RAC or PAC layer. For example, gold pads are commonly used in electrical circuit component fabrication and are entirely compatible with fabricating RAC or PAC layers as required by this invention. Electrical connection to the surface of a thick film which has already been coated on the substrate and fired to produce the electrically conductive RAC or PAC phase is also possible. Metal pads (e.g., indium) can be made to adhere to the crystalline RAC or PAC surface at relative low temperatures (<200° C.). Subsequent electrical connection to the the overlying metal pad can be made using conventional bonding techniques—e.g., soldering techniques, such as with a lead tin solder. For example, copper wire can be soldered to the overlying pad to complete the desired electrical conduction path.

Figure 2:
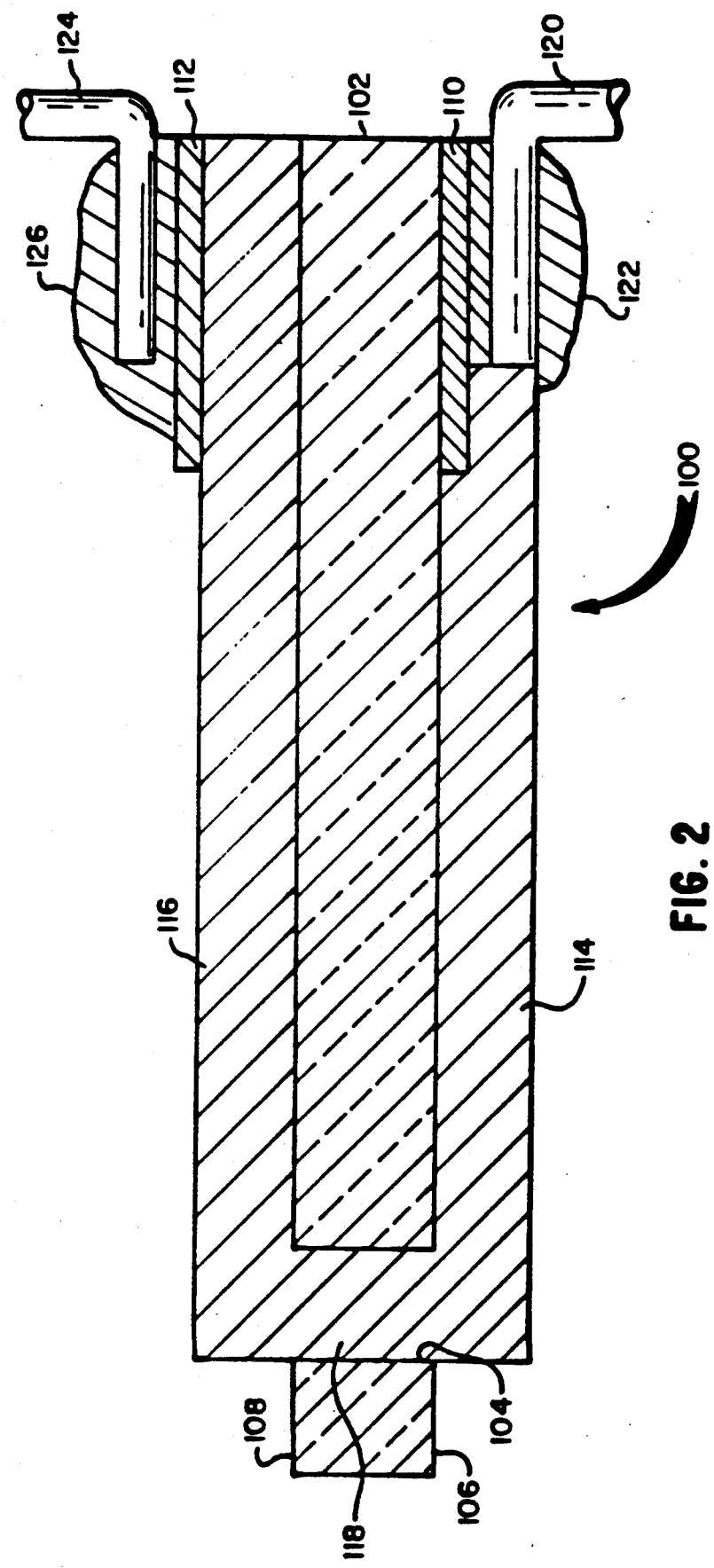

FIG. 2 illustrates a cross-section of an electrical circuit component 100 according to this invention. An insulative substrate 102 is provided having an aperture 104 extending between first and second major surfaces 106 and 108 of the substrate. Metal pad 110 is located on the first major surface of the substrate. Thick film RAC or PAC layers 114 and 116 are located on the first and second major surfaces of the substrate. The RAC or PAC layer 114 in part overlies the metal pad 110. A portion 118 of the composition forming the RAC or PAC layers extends into the aperture 104 connecting the RAC or PAC layers on opposite surfaces of the substrate. A metal lead 120 is bonded to the first RAC or PAC layer and the metal land 110 by solder 122. A second metal lead 124 is connected to the second RAC or PAC layer through interposed metal pad 112 by solder 126. Instead of being soldered the leads can alternatively be bonded by any other convenient conventional means, such as ultrasonic wire bonding or thermal compression bonding.

Although for simplicity in FIG. 2 the RAC or PAC layers are shown as forming linear conduction paths, they can independently form any conduction path configuration found in conventional circuits. For example, the conduction path can be serpentine or sinuous. It can be spiral, as in planar motor or generator windings. Further, instead of itself providing the entire conduction path between the leads 120 and 124, the RAC or PAC layers can form a conduction path in series and/or in parallel with conventional electrical circuit components, such as resistors, capacitors, transistors, diodes, integrated circuit elements, and the like.

Any rare earth alkaline earth copper oxide composition known to be convertible to a crystalline phase can be employed in forming the coated articles of this invention. For example, any of the RAC compositions disclosed in publications P-1 through P-6 can be formed and converted to a crystalline phase by the process of this invention.

Electrically conductive crystalline RAC layers can be formed on a wide variety of substrates. In general any conventional electrical conductor substrate capable of withstanding processing temperatures can be employed. For example, metal, glass, ceramic, and semiconductor substrates all possess sufficient thermal stability to accept crystalline RAC layers applied by one or more of the procedures described above. Substrates in both polycrystalline and monocrystalline form have been successfully employed.

To achieve articles according to this invention which are not only electrically conductive, but also exhibit high $T_c$ levels, thereby rendering them attractive for high conductivity (e.g., superconducting) electrical applications, it has been observed that some combinations of substrates and rare earth alkaline earth copper oxides are particularly attractive in exhibiting higher $T_c$ levels and higher maximum temperatures at which superconductivity is in evidence.

One specifically preferred class of high $T_c$ articles according to this invention are those in which the crystalline RAC layer consists of greater than 45 percent by volume of a rare earth alkaline earth copper oxide which is in a tetragonal $K_2NiF_4$ crystalline phase. The $K_2NiF_4$ crystalline phase preferably constitutes at least 70 percent and optimally at least 90 percent by volume of the RAC layer.

A preferred rare earth alkaline earth copper oxide exhibiting this crystalline phase satisfies the metal ratio:

$$L_{2-x}:M_x:Cu \qquad (I)$$

where
L is lanthanide,
M is alkaline earth metal, and
x is 0.05 to 0.30.

Among the preferred lanthanides, indicated above, lanthanum has been particularly investigated and found to have desirable properties. Preferred alkaline earth metals are barium and strontium. Optimum results have been observed when x is 0.15 to 0.20.

Thus, in specifically preferred forms of the invention LBC or LSC layers exhibiting a tetragonal $K_2NiF_4$ crystalline phase are present and capable of serving high conductivity applications, including those requiring high $T_c$ levels and those requiring superconductivity at temperatures in excess of 10° K. Specific LBC layers in the tetragonal $K_2NiF_4$ crystalline phase have been observed to have $T_c$ levels in excess of 40° K.

Another specifically preferred class of high $T_c$ articles according to this invention are those in which the crystalline RAC layer consists of greater than 45 percent by volume of a rare earth alkaline earth copper oxide which an $R_1A_2C_3$ crystalline phase, believed to be an orthorhombic Pmm2 or orthorhombically distorted perovskite crystal phase. This phase preferably constitutes at least 70 percent by volume of the RAC layer.

A preferred technique for producing a high $T_c$ coating employing an intermediate layer of the LAC composition metal ratio I above, particularly an LBC or LSC composition, is to heat the intermediate layer on the substrate to a temperature of about 925° to 975° C. and then increase the temperature to about 975° to 1050° C. Following conversion of the LAC layer to the tetragonal $K_2NiF_4$ crystalline phase, it is cooled slowly at rate of of 25° C. or less per minute until it reaches a temperature of 550° to 450° C. The LAC layer is then held at this temperature or reheated to this temperature in the presence of an oxygen atmosphere until oxygen equilibration is substantially complete, typically about 20 to 120 minutes.

A preferred rare earth alkaline earth copper oxide exhibiting this crystalline phase satisfies the metal ratio:

$$Y:M_2:Cu_3 \qquad (II)$$

where M is barium, optionally in combination with one or both of strontium and calcium.

Although the $R_1A_2C_3$ crystalline phase by its crystal lattice requirements permits only a specific ratio of metals to be present, in practice differing ratios of yttrium, rare earth, and copper are permissible. The metal in excess of that required for the $R_1A_2C_3$ crystalline phase is excluded from that phase, but remains in the YAC layer. This is further illustrated in the examples below.

A preferred technique for producing a high $T_c$ coating employing an intermediate layer of the YAC composition satisfying metal ratio II above, particularly YBC, is to heat the intermediate layer on the substrate to a temperature greater than 900° C., but less than 950° C., optimally 920° to 930° C. Following conversion of the intermediate layer to the $R_1A_2C_3$ crystalline phase, it is cooled slowly at rate of of 25° C. or less per minute until it reaches a temperature of 750° to 400° C. The YAC layer is then held at this temperature or reheated to this temperature following cooling in the presence of an oxygen atmosphere until oxygen equilibration is substantially complete, typically about 20 to 120 minutes.

Any heavy pnictide mixed alkaline earth copper oxide composition known to be convertible to a conductive crystalline phase can be employed in forming the coated articles of this invention. The term "heavy pnictide" is employed to designate Group 15 elements having an atomic number of at least 51—i.e., bismuth and antimony, alone or in combination with a minor amount of lead. Generally the heavy pnictide is bismuth alone or in combination with from 0 to 30 mole percent of one or a combination of antimony and lead. The term "alkaline earth" indicates elements of Group 2. In a preferred form the mixed alkaline earth elements are a combination of calcium and at least one heavy alkaline earth—i.e., an alkaline earth having an atomic number of at least 38. The preferred heavy alkaline earth is strontium alone or in combination with from 0 to 10 mole percent barium, based on total heavy alkaline earth.

Superconductivity has been observed in crystalline phases of heavy pnictide mixed alkaline earth copper oxides which satisfy the metal ratios:

$$P_2A_{x-y}Ca_yCu_z$$

where
P is a heavy pnictide consisting essentially of bismuth and from 0 to 30 mole percent of one or a combination of antimony and lead,
A is heavy alkaline earth consisting essentially of strontium and from 0 to 10 mole percent barium,
x is the integer 3 or 4;
y ranges from 0.5 to 2; and
z is the integer 2 or 3.

In a preferred form in which the heavy pnictide is bismuth and the heavy alkaline earth is strontium, superconducting oxide phases satisfy the metal ratios:

$$Bi_2Sr_{x-y}Ca_yCu_z$$

where x, y, and z are as noted above. From studies of bulk bismuth strontium calcium copper oxides (BSCCO) the following crystalline phases and their superconducting characteristics have been correlated:

| | | |
|---|---|---|
| BSCCO-2111 | 24Å | 8° K |
| BSCCO-2212 | 30Å | 80° K |
| BSCCO-2223 | 37Å | 105° K | where the four digit number indicates the ratio of metal atoms in the crystal, the Angstrom indicates the identified crystal unit cell c axis length, and the temperature indicates $T_o$.

While strontium and calcium are indicated in these BSCCO compositions by whole numbers, the strontium and calcium are interchangeable in all proportions within the limits of y, suggesting that they form solid solutions. Thus, the BSCCO crystalline phases exhibiting superconductivity above the boiling point of liquid nitrogen (77° K.) which are preferably present in the thick films of the conductive elements of the invention satisfy the relationships:

$$Bi_2Sr_{3-y}Ca_yCu_2$$

where y ranges from 0.5 to 1.5 and $$Bi_2Sr_{4-y}Ca_yCu_3$$

where y ranges from 1.5 to 2.0.

To form these superconductive phases as a thick film the same metals in the same ratios are preferably employed in choosing the metal-ligand compounds employed as starting materials. However, it is not essential that the metals forming the metal-ligand compound starting materials be coated in the same proportions as they appear in the superconductive crystalline phase or phases of the final thick film. In crystallizing an excess of one or more of the metals is simply excluded from superconductive phase or phases being formed. The excluded metals remain as separate phases in the final thick film coating. As demonstrated in the Examples below large imbalances in metal ratios are entirely compatible with achieving superconductive thick films.

It is preferred that the metal-ligand compounds be selected to satisfy the relationship:

$$P_aA_{b-c}Ca_cCu_d$$

where
P is a heavy pnictide consisting essentially of bismuth and from 0 to 30 mole percent of one or a combination of antimony and lead,
A is heavy alkaline earth consisting essentially of strontium and from 0 to 10 mole percent barium,
a ranges from 2 to 5;
b ranges from 3 to 4;
c ranges from 0.5 to 2; and
d ranges from 2 to 5.

Where the heavy pnictide is bismuth and the heavy alkaline earth is strontium, the preferred ratios of metals in metal-ligand starting materials preferably satisfy the relationship:

$$Bi_aSr_{b-c}Ca_cCu_d$$

where
a ranges from 2 to 5;
b ranges from 3 to 4;
c ranges from 0.5 to 2; and
d ranges from 2 to 5.

BSCCO-2223 superconductive crystalline phases are particularly favored when the metal-ligand starting materials include an excess of either bismuth or copper.

The ligands present in the metal-ligand compounds described above form no part of the final article and therefore can be chosen based solely upon convenience in performing the process steps described above. Ligands are chosen first of all for their ability to form solutions in which rare earth or heavy pnictide, alkaline earth, and copper combined with the ligands are each soluble in the desired proportions. Second, the ligands are chosen to be volatilizable during heating to form the intermediate RAC or PAC layer.

By "volatilizable" it is meant that the ligand or its component elements other than oxygen can be removed from the substrate surface at temperatures below the crystallization temperature of the PAC layer.

Inorganic ligands, such as nitrate, sulfate, and halide ligands, are illustrative of preferred ligands satisfying the criteria set forth above. Nitrate, bromide, and chloride ligands are particularly preferred. In general the ligands are chosen so that each of the heavy pnictide, alkaline earth, and copper ligand compounds exhibit approximately similar solubility characteristics.

Any evaporative solvent for the metal-ligand compounds can be employed for particle fabrication. Again, the solvent forms no part of the final article. Polar solvents, such as water or alcohols (e.g., methanol, ethanol, propanol, etc.), are particularly suited for use with metal-ligand compounds containing the inorganic ligands noted above.

Where a paste is coated, the paste contains either a small residual portion of the original solvent for the metal-ligand compounds or a different liquid to promote cohesion. The liquid fraction of the paste must be volatilizable. The evaporative solvents noted above all satisfy this criteria.

The paste apart from the metal-ligand particles can be identical in composition to conventional inks employed in screen printing. Screen printing inks normally contain an active ingredient (in this instance supplied by the metal-ligand particles), binders to promote substrate adhesion (such as glass frit or crystalline oxide powder), screening agents used to enhance the rheological properties of the ink—usually a higher molecular weight polymer, such as poly(vinyl alcohol) or poly(ethylene glycol), and a liquid, most commonly water or an alcohol. It is a particular advantage of this invention that the metal-ligand particles and liquid together provide excellent rheological and adhesion properties without the necessity of incorporating other screen printing ink ingredients.

Thick films produced by the present invention can vary widely in their thicknesses. Final thicknesses are contemplated in the range of from about 5 to 200 $\mu$m, with thicknesses of about 10 to 100 $\mu$m being preferred for most thick film applications. With care to avoid thermal stresses still greater coating thicknesses should be possible. Thin PAC films can be readily fabricated by the process of this invention, although in most instances the procedures of Mir et al U.S. Pat. No. 4,880,770 or Agostinelli et al U.S. Pat. No. 4,950,643 commonly assigned, are preferred for forming thin films below 1 $\mu$m in thickness.

The substrate of the thick film elements of this invention are referred to as insulative only because it is insulative in comparison to the conduction properties of the RAC or PAC layer. As herein employed the term "insulative substrate" refers to any substrate having an electrical resistance of sufficiently greater magnitude than that of the RAC or PAC layer that current flow occurs predominantly through the RAC or PAC layer rather than the substrate on which it is formed. Where the circuit element is intended to be used at temperatures well below ambient, such as below $T_c$ or $T_o$ of the RAC or PAC layer, the insulative substrate can actually be more conductive than the RAC or PAC layer at ambient temperatures.

Electrically conductive crystalline RAC or PAC layers can be formed on a wide variety of substrates. In general any conventional electrical conductor substrate capable of withstanding processing temperatures can be employed. For example, metal, glass, ceramic, and semiconductor substrates all possess sufficient thermal stability to accept crystalline RAC or PAC layers applied by one or more of the procedures described above. Substrates in both polycrystalline and monocrystalline form have been successfully employed.

The present invention has provided thick films exhibiting high $T_c$ and superconducting properties when coated on substrates comprised of an aluminum oxide or nitride. The thick film RAC or PAC layers of this invention can be formed on both monocrystalline and polycrystalline alumina. In addition, substrates which contain aluminum and oxygen in combination with one or more metals, such as in spinel substrates, are contemplated. $MgAl_2O_4$ is an exemplary substrate of this type. It is, of course, recognized that spinels in addition to those which contain aluminum as one metal elements can be employed as substrates useful in the practice of this invention.

Any of the various other types of substrates known to be useful in forming RAC or PAC thin film conductive elements can also be employed. Alkaline earth oxides constitute a preferred class of substrate materials. They are in general relatively inert, refractory materials which exhibit limited interaction with the RAC or PAC layers during their formation. Magnesia in either monocrystalline (i.e., periclase) or polycrystalline form constitutes a particularly preferred substrate material because of its low level of interaction with the RAC or PAC layer. Strontium titanate, because it can be readily formed in a perovskite crystalline form, constitutes another preferred alkaline earth oxide substrate material.

Semiconductor wafers, particularly monocrystalline silicon and III-V compound wafers, also constitute useful classes of substrates for the articles of this invention.

Another specifically contemplated class of substrate materials are refractory metals. Such metals are, of course, well suited to withstanding RAC or PAC layer crystallization temperatures of 1000° C. or more. Refractory metals such as tungsten, tantalum, titanium, and zirconium are particularly contemplated. The refractory metal can form the entire substrate or a thermally resistant layer onto which the RAC or PAC layer is coated.

Although some interaction between substrate materials and a contiguous PAC layer is believed to occur when the article is heated to temperatures above about 900° C., thick film PAC layers are much less affected by substrate interactions than thin PAC or RAC layers. Thus, direct coating of the PAC thick film onto a variety of substrate materials is contemplated.

Where barrier layers are contemplated to further reduce or eliminate interactions between the substrate and the RAC or PAC thick film, barriers can be chosen from a variety of materials. The refractory metals noted above, platinum (platinum, osmium, or iridium) metals, gold, and silver are all feasible barrier materials. The refractory metals under the conditions of processing convert to the corresponding oxides. When the substrate is silicon, a metal silicide barrier layer can be employed. Aluminum nitride and silicon nitride are both contemplated barrier layer materials. Generally any of the preferred substrate compositions noted above also form useful barrier layer compositions. The choice of a specific barrier layer or barrier layer combination will, of course, in many instances be influenced by the composition of the substrate and opportunities for simplifying processing that a particular substrate and barrier layer selection offers.

Specifically contemplated barrier layer arrangements of the types described above are more specifically discussed in Mir et al U.S. Pat. No. 4,880,770 and Hung et al U.S. Pat. No. 4,908,348, both here incorporated by reference, and Agostinelli et al U.S. Ser. No. 330,409, filed Mar. 30, 1989, allowed and commonly assigned, a continuation of U.S. Ser. No. 85,047, filed Aug. 13, 1987.

Thick films produced by the present invention can vary widely in their thicknesses. Final thicknesses are contemplated in the range of from about 5 to 200 $\mu m$, with thicknesses of about 10 to 100 $\mu m$ being preferred for most thick film applications. With care to avoid thermal stresses still greater coating thicknesses should be possible. As previously noted thin films can be readily fabricated by the process of this invention.

EXAMPLES

Details of the preparation and performance of articles according to this invention are illustrated by the following examples.

RAC-EXAMPLE 1

This example illustrates the formation of a conductive thick film coating of $Y_1B_2C_3$ on sapphire.

RAC-PFS-1

A particle-forming solution was prepared by mixing the following ingredients in the proportions indicated, corresponding to the cation ratio in $Y_1B_2C_3$:

| | |
|---|---|
| $Y(NO_3)_3 6H_2O$ | 13.41 g |
| $Ba(NO_3)_2$ | 18.30 g |
| $Cu(NO_3)_2 2.5H_2O$ | 24.42 g |
| $H_2O$ | 500.00 mL. |

The water employed was distilled water. The solution was filtered through a 0.45 $\mu m$ membrane filter.

RAC-PFS-1 was converted to a mixed powder and paste by spray drying. A Yamato® Model GA-31 spray drier was employed in its normal mode of operation.

| | |
|---|---|
| Inlet Temp. | 200° C. |
| Outlet Temp. | 80° C. |
| Aspirator Setting | 2.5 |
| Pump Setting | 2.5 |
| Drying Air | 0.3–0.35 m³/min. |
| Atomizing Air | 0.53 MPa |
| Pulsed Air Interval | 10 sec. |

A #2050SS liquid nozzle and a #64-5SS air nozzle were used. The spraying rate was about 10 mL/min.

The material obtained from the spray drier was a mixture of a dry powder (pale blue) and a partially hydrated powder which was a thick paste (sky blue). Addition of approximately 10% by weight water transformed the dry powder into a paste. Chemical analysis indicated the cation ratio to be identical to that of the starting solution.

The paste was spread onto a monocrystalline alumina (sapphire) 1102 crystal surface. Paste coating thicknesses were in the 10 to 20 $\mu m$ range.

The paste was heated to 925° C. on the substrate in air in a furnace and held at that temperature for 5 minutes. At the end of 5 minutes the coated article was allowed to cool at the rate of <25° C. per minute.

The resulting YBC crystalline layer was about 14 $\mu m$ in thickness and adhered well to the substrate. Sheet resistance of the YBC crystalline layer was determined to be in the order of 20 to 40 ohms per square at room temperature. X-ray analysis confirmed that the YBC crystalline layer exhibited a $Y_1B_2C_3$ phase.

RAC-EXAMPLE 2

This example illustrates the formation of a high transition temperature superconductive thick film coating of $Y_1B_2C_3$ on monocrystalline MgO.

RAC-PFS-2

A particle-forming solution was prepared by mixing the following ingredients in the proportions indicated:

| | |
|---|---|
| $Y(NO_3)_3 6H_2O$ | 28.15 g |
| $Ba(NO_3)_2$ | 36.6 g |
| $Cu(NO_3)_2 2.5H_2O$ | 51.29 g |
| $H_2O$ | 750 mL. |

The water employed was distilled water. The solution was filtered through a 0.45 $\mu m$ membrane filter. To compensate for possible loss of the yttrium and copper salts a 5% molar excess of each was employed above the desired $Y_1B_2C_3$ stoichiometric molar ratio. Subsequent investigations have shown that no significant loss either yttrium or copper salts occurs. Therefore, a stoichiometric excess of these salts as been shown not to be necessary but nonetheless useful.

RAC-PFS-2 was converted to a dry powder by spray drying, using the same spray drier and nozzles as in RAC-Example 1.

| | |
|---|---|
| Inlet Temp. | 200° C. |
| Outlet Temp. | 100–105° C. |
| Aspirator Setting | 3 |
| Pump Setting | 4 |
| Drying Air | 0.3–0.35 m³/min. |
| Atomizing Air | 0.30 MPa |
| Pulsed Air Interval | 20 sec. |

The same nozzles and spraying rate were employed as in RAC-Example 1.

The powder obtained from the spray drier very dry and was stored briefly in a vacuum oven before use.

A small amount of the powder was mixed with water in the amount of 1 to 2 drops of water per gram of powder to form a paste. The paste was then hand coated on a monocrystalline MgO substrate to a thickness of approximately 50 μm.

The coated substrate was placed on a hot plate at room temperature and heated rapidly to 535° C., at which time it was covered with aluminum foil. Heating was continued for approximately 30 minutes, at the end of which time the temperature of the coating was in the range of from 590° to 650° C. The sample was allowed to cool under the aluminum foil until it reached about 250° C. and was then taken off the hot plate. It was then cooled further to room temperature at a relatively rapid rate.

The sample was next heated to 925° C. in air in a furnace and held at that temperature for 15 minutes. At the end of 15 minutes the sample was allowed to cool to room temperature at the rate of less than 10° C. per minute.

The resulting YBC crystalline thick film adhered well to the substrate. X-ray analysis indicated the orthorhombic $Y_1B_2C_3$ phase, with a small amount of other phases being present. The secondary phases appeared as green blotches on the surface of the black sample. There were some cracks in the coating.

The sample was then oxygen annealed by being held at 650° C. for 30 minutes in an oxygen atmosphere and then cooled in the oxygen atmosphere to about 290° C. over a period of 32 minutes.

The sheet resistance of the sample at room temperature before and after oxygen annealing was 3 ohms per square, measured with a four point probe.

The sample was cooled with its resistance being concurrently measured. The resistance remained constant until the region of 95° to 100° K. was reached. At 77° K.±2° K. the sample was entirely superconducting. Remeasurement determined $T_c$ to be 97° K.±2° K. with superconductivity occurring at 76° K.±2° K.

RAC-EXAMPLE 3

This example illustrates screen printing of patterned coatings.

RAC-PFS-3

A particle-forming solution was prepared by mixing the following ingredients in the proportions indicated:

| | | |
|---|---|---|
| $Y(NO_3)_3 6H_2O$ | 26.81 | g |
| $Ba(NO_3)_2$ | 36.59 | g |
| $Cu(NO_3)_2 2.5H_2O$ | 48.85 | g |
| $H_2O$ | 690 | mL |

Preparation was similar RAC-PFS-2, except that no stoichiometric excess of metal salts was included.

RAC-PFS-3 was converted to a wet powder by spray drying, using the same spray drier and nozzles as in Example 1.

| | |
|---|---|
| Inlet Temp. | 180–200° C. |
| Outlet Temp. | 75–85° C. |
| Aspirator Setting | 3 (approx.) |
| Pump Setting | 1.5 |
| Drying Air | 0.3–0.35 m³/min. |
| Atomizing Air | 0.30–0.34 MPa |
| Pulsed Air Interval | 20 sec. |

The same nozzles and spraying rate were employed as in RAC-Example 1.

The wet powder obtained was placed in a drying oven at 110° C. for several days. It was removed and ground using a mortar and pestle. The powder was then converted to a paste by adding approximately 13% by weight water dropwise until a thick consistency was obtained. A portion of the paste was then further diluted to approximately 14% by weight water to give a thinner consistency paste. The two pastes are identified as the diluted and non-diluted pastes.

One sample of the diluted paste was coated onto a polycrystalline alumina insulative support having a gold contact pattern on its surface. The diluted paste was coated so that it overlapped both areas containing the gold contact pattern and defined areas between spaced gold contact areas. The diluted paste was screen printed in a series of parallel rectangular patterns of varied size using a 200 mesh screen.

After a 15 to 20 minute delay the sample coated as described above was heated on a hot plate as described in RAC-Example 2. The sample was heated in air in a furnace at 850° C. for 15 minutes and then cooled at a rate of less than 25° C. per minute to room temperature.

Some cracking of the coating was observed, however resistance probes to spaced gold contact areas joined by the coating demonstrated that the coating provided an electrical conduction path. The final coating was about 24 μm in thickness.

Several more samples processed as described above through the hot plate stage were furnace heated and cooled under varied conditions. Both the diluted and non-diluted paste appeared capable of producing desirable coatings. Higher furnace temperatures and more abrupt changes in temperatures increased the number of cracks observed, but in each instance patterned electrical conductors were obtained. In every instance the gold contact pattern produced satisfactory conductive contact with the YBC layer.

RAC-EXAMPLE 4

This example illustrates coating on polycrystalline alumina and strontium titanate substrates.

A powder was made from a solution similar to PFS-1, except it was 50 mL more concentrated by using the spray drying conditions of Example 2. Using procedures similar to those described in Example 2 coatings were prepared on alumina and strontium titanate supports. The coating thickness after hot plate treatment of the alumina substrate article was 40 to 70 μm. The coating thickness on one portion of the strontium titanate article was 90 to 100 μm and 40 to 60 μm on a second portion.

The samples were heated in air in a furnace at 925° C. for 5 minutes, cooled to room temperature at a rate of less than 25° C. per minute, heated at the rate of 25° to 50° C. per minute to 925° C., held at that temperature for 20 minutes, and then cooled back to room temperature at same rate indicated above. The final coating thicknesses were found to be about half the thicknesses noted above.

After annealing the samples at 925° C. in oxygen, the strontium titanate sample exhibited a sheet resistance of 5 ohms per square while the alumina sample exhibited a sheet resistance of 50 ohms per square at room temperature.

RAC-EXAMPLE 5

This example illustrates forming conduction paths through apertures in a substrate.

A polycrystalline alumina substrate was employed having a thickness of about 1 mm containing five apertures of 0.5 mm in diameter spaced about 1 mm apart.

A coating was prepared on one surface of the substrate by the same procedure described in RAC-Example 2 through the step of cooling to room temperature following hot plate heating, except that RAC-PFS-4 was substituted for RAC-PFS-2 and the spray drier was operated under the conditions indicated below:

RAC-PFS-4

| | |
|---|---|
| $Y(NO_3)_3 6H_2O$ | 40.22 g |
| $Ba(NO_3)_2$ | 54.88 g |
| $Cu(NO_3)_2 2.5H_2O$ | 73.27 g |
| $H_2O$ | 1400.00 mL. |
| Inlet Temp. | 200° C. |
| Outlet Temp. | 90–95° C. |
| Aspirator Setting | 3.1 |
| Pump Setting | 1.7 |
| Drying Air | 0.3–0.35 m³/min. |
| Atomizing Air | 0.1 MPa |
| Pulsed Air Interval | 20 sec. |

The paste produced contained 9.3% by weight water.

The opposite major surface of the substrate was then similarly coated and processed, except that the substrate was not placed directly on the hot plate, but was sat on spaced pieces of 1 mm polycrystalline alumina with the first coating being closest located nearest to the hot plate surface.

Following hot plate cooling the article with coatings on opposite major surfaces was placed in a furnace again using the spaced pieces of polycrystalline alumina and further processed as described in Example 2. The first YBC film was 10 μm in thickness while the second YBC film was 30 μm in thickness.

By applying electrical probes to the first and second surfaces it was determined that electrical conduction paths through the apertures had been established. No current conduction occurred when either or both probes were placed on uncoated substrate surfaces adjacent to the YBC film.

PAC-EXAMPLE 1

This example illustrates the formation of a conductive thick film crystalline coating of bismuth strontinum calcium copper oxide (BSCCO) on a polycrystalline alumina substrate.

PAC-PFS-1

A particle-forming solution was prepared by mixing the following ingredients in the proportions indicated:

| | |
|---|---|
| $Bi(NO_3)_3 5H_2O$ | 48.51 g |
| $Sr(NO_3)_2$ | 21.16 g |
| $Ca(NO_3)_2 4H_2O$ | 8.21 g |
| $Cu(NO_3)_2 2.5H_2O$ | 23.27 g |
| $H_2O$ | 300.00 mL |
| $HNO_3$ | 20.00 mL |

The water employed was distilled water. The bismuth was dissolved first in the water and nitric acid. The other nitrates were then added and a clear blue solution was obtained. The original intent was to prepare a composition containing bismuth, strontium, calcium, and copper in a 2212 atomic ratio, but chemical analysis by inductively coupled plasma (ICP) analysis revealed a 3313 ratio composition. A possible explanation is that the calcium nitrate contained more water than indicated. PAC-PFS-1 was diluted to 1 liter with water with 15 mL of nitric acid being added to avoid precipitation.

PAC-PFS-1 was converted to a powder by spray drying. A Yamato ™ Model GA-31 spray drier was employed in its normal mode of operation.

| | |
|---|---|
| Inlet Temp. | 200° C. |
| Outlet Temp. | 90° C. |
| Pump Setting | 2.0 |
| Drying Air | 0.29–0.35 m³/min. |
| Atomizing Air | 0.29 MPa |

A #2050SS liquid nozzle and a #64-5SS air nozzle were used. The spray drier was preheated for 1 hour before spraying PAC-PFS-1, which was maintained at about 80° C. during the run.

A paste was formed from the powder obtained by spraying by adding 19 percent by weight water, based on the weight of the powder. The paste appeared to have good rheological properties for screen printing. The paste was coated on a 99.5% pure polycrystalline alumina substrate and heated at the rate of 3° C. per minute under oxygen on a hot plate to a temperature of approximately 400° C.

The coated substrate was inserted into a furnace preheated to 875° C. and held for 10 minutes. Upon examination of the structure of the thick film, there appeared to be two different types of regions. Long needle-like crystals were observed in a first type region, and a resistance of >100 ohms was observed in this type region. A dense mat of crystals appeared in a second type region, and a resistance of 20 to 60 ohms was observed in this type region.

PAC-EXAMPLE 2

This example illustrates the formation of a BSCCO composition thick film on a polycrystalline magnesia substrate, with the film exhibiting a high superconducting onset transition temperature, $T_c$.

The paste from PAC-Example 1 was coated on a hot pressed polycrystalline magnesia substrate. The coated substrate was heated at the rate of 3° C./min to 500° C., held at that temperature for 5 minutes, ramped at the rate of 5° C. per minute to 880° C., and held at 880° C. for 10 minutes before cooling at the rate of less than 20° C. per minute to room temperature The room temperature resistance of the BSCCO composition thick film on the polycrystalline magnesia substrate was >1 kilo-ohm. X-ray diffraction analysis indicated a randomly oriented 30 Å (BSCCO-2212) crystalline phase.

The thick film coated substrate was then inserted into a furnace preheated to 880° C., fired for an additional 20 minutes at 880° C., and then quenched to room temperature. The sheet resistance of the thick film after this second heating was 3 to 4 ohms per square. X-ray diffraction analysis showed the randomly oriented 30 Å crystalline phase to be predominant. Some secondary phases were also present, including a 24 Å [BSCCO-2(11)1] phase.

The film showed a superconducting onset transition temperature, $T_c$, of 93° K. A resistance of less than about 0.5 ohm was observed at temperatures below 25° K.

PAC-EXAMPLE 3

This example illustrates the formation of a superconducting crystalline BSCCO thick film on a monocrystalline magnesia substrate.

Aqueous stock solutions of 0.1M bismuth nitrate, strontium nitrate, and copper nitrate were prepared. Additional nitric acid was added to the bismuth solution in order to dissolve the powder completely (7.5 mL/L $H_2O$). A 0.05M calcium nitrate solution was also prepared. These solutions were mixed in equal parts to make the final nitrate solution employed for spray drying. The following parameters were used:

| Inlet Temp. | 200° C. |
|---|---|
| Outlet Temp. | 80° C. |
| Pump Setting | 2.0 |
| Drying Air | 0.32 m³/min. |
| Atomizing Air | 0.2 MPa |

A #2050SS liquid nozzle and a #64-5SS air nozzle were used. After approximately 1 hour spraying was interrupted, then recommenced with the atomizing air pressure increased to 0.25 MPa. The outlet temperature dropped to 60° C., but then returned to 80° C. The solution was sprayed at the rate of about 400 mL per hour. After changing to larger nozzles (#70SS air, #2850SS liquid), the outlet temperature dropped to 50° C., and the solution passed through the system without completely drying. To maintain the solubility of the salts, 20 mL of nitric acid was added to the solution accompanied by heating the solution to about 80° C. The final solute concentration of the solution was 0.03 g per mL, with a useable quantity of powder being formed.

A paste was made from the powder by adding less than 20 percent by weight water, based on the weight of the powder. The atomic ratio of bismuth, strontium, calcium, and copper in the paste was 2212. The paste is hereinafter referred to as the 2212 paste.

Samples of the 2212 paste and the 3313 paste prepared as described in PAC-Example 1 were coated on the {100} crystallographic surface of several substrates of monocrystalline magnesia. The coated substrates were heated at the rate of 3° C. per minute to 500° C., held at 500° C. for 5 minutes, ramped at 5° C. per minute to 880° C., and held at that temperature before cooling at the rate of 10° C. per minute to 850° C. the samples were held at 850° C. for 10 minutes and then cooled to room temperature at the rate of 10° C. per minute.

The substrate adhesion of the thick films prepared from both the 2212 and 3313 pastes was poor. The sheet resistance of samples A and B prepared from the 3313 paste were 17 and 8.3 ohms per square, respectively. The sheet resistance of samples K and L prepared from the 2212 paste were 47 and 20 ohms per square, respectively.

The B and L samples were inserted into a furnace preheated to 890° C. and held at that temperature for 10 minutes. The samples were cooled to room temperature at a rate of less than 20° C. per minute.

The sheet resistance of sample B was 48 ohms per square. The sheet resistance of sample L was 2.3 ohms per square. The thickness of the sample L thick film was 15 μm.

Samples A and K, which did not receive the second firing, showed poorly crystallized X-ray diffraction patterns. Samples B and L, which received the second firing at 890° C., showed well crystallized, oriented films with 24 Å and 30 Å phases present. The second firing changed the thick film microstructure from small, randomly oriented grains to large oriented platelets interspersed with large needles. Sample L exhibited a superconducting onset transition temperature ($T_c$) of about 90° K. and became superconducting at 76° K. ($T_o$). Sample B exhibited a superconducting onset transition temperature ($T_o$) of about 90° K. and became superconducting at 81° K. ($T_o$).

When the differences in starting compositions and spraying conditions used in preparing the 3313 and 2212 pastes are taken into account, it is apparent that the process of the invention allows considerable latitude in the composition of the solutions employed in spraying and the exact choice of spraying conditions. Interestingly, achieving the desired 30 Å (BSCCO-2212) phase for low temperature conductivity does not depend on beginning with starting materials in this ratio. The examples additionally demonstrate the importance of reaching firing temperatures of at least 890° C. in an oxidizing atmosphere, such as air, to achieve higher values of $T_c$ and $T_o$.

PAC-EXAMPLE 4

This example illustrates the preparation of a 30 Å (BSCCO-2212) crystalline thick film on a polycrystalline alumina substrate.

The 2212 paste from PAC-Example 3 was coated on a 99.5% pure polycrystalline alumina substrate and heated at the rate of 3° C. per minute to 500° C., held at 500° C. for 5 minutes, ramped at the rate of 5° C. per minute to 880° C., held at 880° C. for 20 minutes, and then cooled at less than 20° C. per minute to room temperature.

The thick film was well adhered to the substrate, but not uniform in its structure. In a first type region the thick film was made up predominantly of needle-like crystals. A second type region was made up predominantly of small grains as well as a few large platelets. X-ray diffraction analysis of the second type region showed predominantly randomly oriented 30 Å phase with only a small amount of the 24 Å phase. The sheet resistance of the second type of region was 24 ohms per square.

PAC-EXAMPLE 5

This example illustrates superconductivity at higher temperatures produced by interposing between initial heating and the maximum heating temperatures an intermediate heating sequence.

PAC-PFS-3

Additional nitric acid (20 mL/L $H_2O$) was mixed with PAC-PFS-2 (PAC-Example 3) to increase the solubility of bismuth nitrate.

The spray drying parameters used to convert the new solution into a powder were as follows:

| Inlet Temp. | 200° C. |
|---|---|
| Outlet Temp. | 80° C. |
| Aspirator Setting | 3 |
| Pump Setting | 2.0 |
| Drying Air | 0.23–0.27 m³/min. |

-continued

| | |
|---|---|
| Atomizing Air | 0.29 MPa |

A #2850SS liquid nozzle and a #70SS air nozzle were used.

A 2212 paste was made from the powder by adding water. The paste was coated on the {100} crystallographic surface of several monocrystalline magnesia substrates. The coated substrates were heated at the rate of 3° C., per minute to 500° C., held at 500° C. for 5 minutes, ramped at the rate of 5° C. per minute to 880° C., held at 880° C. for 20 minutes, and then cooled at a rate of less than 20° C. per minute to room temperature.

One sample (5A) was then inserted into a furnace preheated to 885° C., and held at that temperature for 2.5 hours before quenching to room temperature. Examination of Sample 5A revealed a randomly oriented 30 Å phase forming the thick film. Sample 5A was then heated to 900° C. and held at this temperature for 12 minutes, followed by quenching to room temperature.

A second sample (5B) was heated to 900° C. and held at that temperature for 12 minutes, followed by quenching to room temperature. The treatment of Samples 5A and 5B therefore differed soley by the intermediate cycle of heating Sample 5A to 885° C.

The ratio of the X-ray diffraction analysis peak heights of the {008} crystallographic plane of the 30 Å phase to that of the {006} crystallographic plane of the 24 Å phase (23°2Θ:22°2Θ) was taken as an indication of the relative amounts of each phase. The ratio of the 30 Å {0012} plane to the 24 Å {0010} plane (37°2Θ:35°2Θ) was also examined. From comparisons based on the {008} and {006} planes, Sample 5A, which received the intermediate heating, showed a 45 percent increase in the 30 Å phase as compared to Sample 5B. From comparisons based on the {0012} and {0010} planes, Sample 5A, which received the intermediate heating, showed a 53 percent increase in the 30 Å phase as compared to Sample 5B.

The thickness of the thick film of Sample 5A decreased from 80 μm to 35 μm after 900° C. heating step. The microstructures of both Samples 5A and 5B showed large, oriented platelets interspersed with large needles following the final heating step.

Sample 5A exhibited a $T_c$ of 86° K. and a $T_o$ of 76° K. Sample 5B exhibited a $T_c$ of 89° K. and a $T_o$ of 62° K. An improvement of 14° K. in $T_o$ can therefore be attributed to the intermediate heating step.

PAC-EXAMPLE 6

This example illustrates superconductivity at higher temperatures resulting from following heating at 900° C. with a post-firing to 875° C.

A sample was prepared similarly as in PAC-Example 5 through the step of heating to 880° C. for 20 minutes and cooling to room temperature.

The sample was inserted into a furnace which had been preheated to 900° C. and held there for 45 minutes before cooling. The sample was reinserted into the 900° C. furnace and kept for an additional 2 hours to increase the proportion of the 24 Å phase. The sample exhibited two types of regions. The first type of region was smooth and shiny with few needles. The second type of region had many needles and exhibited a to brown tinge. X-ray diffraction analysis of both regions showed 24 Å and 30 Å phases to be present. Overall the X-ray diffraction patterns the regions were similar, except that the 30.2°2Θ peak in first type region was more pronounced.

The sample was given a post heat treatment at 875° C. for 1 hour. The 24 Å phase completely disappeared from the X-ray diffraction pattern. The peak at 30.2°2Θ was still present, however. The only change in the appearance of the microstructure was the emergence of small dark spots, observed using an optical microscope.

The thickness of the first type region was 90 μm, and its room temperature resistance was less than 1 ohm. The $T_c$ of this region was 97° K.; the $T_o$ of this region was 85° K.±2° K. This compared favorably with both Samples 5A and 5B.

PAC-EXAMPLE 7

This example illustrates the ability to achieve similar superconductivity results by firing in the presence of a non-oxidizing atmosphere, in this instance argon, but with firing temperatures being shifted to lower levels.

Samples were prepared similarly as in PAC-Example 5 through the step of heating to 880° C. for 20 minutes and cooling to room temperature.

Sample 7A was inserted into a furnace preheated to 835° C. with flowing argon (100 cc/min at STP). The sample was held at 835° C. in argon for 30 minutes and then quenched to room temperature in air.

Sample 7B was inserted into a furnace preheated to 835° C. with flowing oxygen (100 cc/min at STP) for 30 minutes and then quenched to room temperature in air.

Sample 7A exhibited a thick film which was crystallographically oriented and well adhered to the substrate. Both 24 Å and 30 Å phases were present. The thickness of the film decreased from greater than 100 μm to 50 μm. The microstructure exhibited large oriented platelets interspersed with large needles.

Sample 7B exhibited a thick film which was poorly adhered to the substrate and randomly oriented. The microstructure was made up of fine grains. This demonstrated that higher temperatures are required for heating in an oxidizing atmosphere than in a non-oxidizing atmosphere.

Sample 7A was then heated to 790° C. and held at 795° to 800° C. for 30 minutes in argon to provide a post-firing heat treatment. X-ray diffraction analysis revealed only a 30 Å phase. The microstructure revealed some additional small black spots when viewed with an optical microscope. The thickness of the film decreased to 23 μm.

One portion of Sample 7A ($7A^1$) was tested for superconductivity at this stage of processing while a second portion, $7A^2$, was oxygen annealed for 3 hours at about 500° C. Sample $7A^1$ had a $T_c$ of 87° K. and a $T_o$ of 40° K. Sample $7A^2$ had a $T_c$ of 88° K. and a $T_o$ of 55° K.

PAC-EXAMPLE 8

This example illustrates a superconducting crystalline BSCCO-2212 thick film on a polycrystalline alumina substrate.

A 2212 paste similar to that in PAC-Example 5 was coated on a 99.5% pure polycrystalline alumina substrate. The sample was heated at the rate of 5° C. per minute to a temperature of 800° C. and held at 800° C. for 30 minutes, then cooled at a rate of less than 20° C. per minute to room temperature. The sample was then inserted into a furnace preheated to 900° C. and held for 7 minutes before quenching to room temperature. X-ray diffraction analysis showed randomly oriented 30Å phase crystallization and other second order phases.

The sample was then inserted into a furnace preheated to 875° C. and held for 10 minutes before quenching. The X-ray diffraction analysis was not significantly different.

The sample was again inserted into a furnace preheated to 900° C., held for 12 minutes, and then quenched to room temperature. The X-ray diffraction analysis showed a very well oriented 24Å phase and a small amount of the 30Å phase.

The sample was inserted into a furnace preheated to 880° C., held for 12 minutes, and then quenched to room temperature. The X-ray diffraction analysis showed a very well oriented 30 Å phase and only a very small amount of the 24Å and other second order phases. $T_c$ was 87° K.±1° K. $T_o$ was 62° K.±1° K.

The invention has been described in detail with particular reference to preferred embodiments thereof, but it will be understood that variations and modifications can be effected within the spirit and scope of the invention.

What is claimed is:

1. A screen printing composition capable of forming a single application coating having a thickness of at least 5 μm comprised of particles containing inorganic salts forming metal-ligand compounds and a volatilizable liquid in an amount that promotes particle cohesion, where the ligand moieties of the compounds are chosen to be thermally decomposable and the metal moieties of the compounds are chosen to form crystalline superconducting copper oxides on heating, the superconducting copper oxides being chosen from the class consisting of (a) rare earth alkaline earth copper oxides and (b) heavy pnictide mixed alkaline earth copper oxides, characterized in that the particles all contain the same metals in the same ratios.

2. A screen printing composition according to claim 1 further characterized in that the metals forming the particles satisfy the relationship:

$$P_aA_{b-c}Ca_cCu_d$$

where
P is a heavy pnictide consisting essentially of bismuth and from 0 to 30 mole percent of one or a combination of antimony and lead,
A is heavy alkaline earth consisting essentially of strontium and from 0 to 10 mole percent barium,
a ranges from 2 to 5;
b ranges from 3 to 4;
c ranges from 0.5 to 2; and
d ranges from 2 to 5.

3. A screen printing composition according to claim 2 further characterized in that the metals forming the particles satisfy the relationship:

$$Bi_aSr_{b-c}Ca_cCu_d$$

where
a ranges from 2 to 5;
b ranges from 3 to 4;
c ranges from 0.5 to 2; and
d ranges from 2 to 5.

4. A screen printing composition according to claim 1 further characterized in that the metals forming the particles satisfy the relationship:

$$L_{2-x}:M_x:Cu$$

where
L is lanthanide,
M is alkaline earth metal, and
x is 0.05 to 0.30.

5. A screen printing composition according to claim 4 further characterized in that L is lanthanum.

6. A screen printing composition according to claim 1 characterized in that the metals forming the particles satisfy the relationship:

$$R_1:A_2:Cu_3$$

where
R is rare earth and
A is barium or barium in combination with at least one of calcium and strontium.

7. A screen printing composition according to claim 6 further characterized in that R is yttrium.

8. A screen printing composition according to claim 1 further characterized in that the metal ligand compounds are metal halides, sulfates or nitrates.

9. A screen printing composition according to claim 8 further characterized in that the metal halides are chlorides or bromides.

10. A screen printing composition according to claim 8 further characterized in that the metal-ligand compounds are metal nitrates.

* * * * *